United States Patent
Marcade et al.

(10) Patent No.: US 12,052,848 B1
(45) Date of Patent: Jul. 30, 2024

(54) TELESCOPING AIR DAM

(71) Applicant: ZT Group Int'l, Inc., Secaucus, NJ (US)

(72) Inventors: Michael Dennis Marcade, Secaucus, NJ (US); Ellie Elsu, Secaucus, NJ (US); Mark Alan Hammond, Secaucus, NJ (US); Vladimir Igor Lipnevici, Secaucus, NJ (US)

(73) Assignee: ZT Group Int'l, Inc., Secaucus, NJ (US)

( * ) Notice: Subject to any disclaimer, the term of this patent is extended or adjusted under 35 U.S.C. 154(b) by 167 days.

(21) Appl. No.: 17/900,052

(22) Filed: Aug. 31, 2022

(51) Int. Cl.
*H05K 7/20* (2006.01)
(52) U.S. Cl.
CPC .................. *H05K 7/20736* (2013.01)
(58) Field of Classification Search
None
See application file for complete search history.

(56) References Cited

U.S. PATENT DOCUMENTS

| | | | |
|---|---|---|---|
| 4,184,599 A * | 1/1980 | Drake ............... | H05K 13/0069 211/175 |
| 7,009,839 B2 * | 3/2006 | Clinard ............. | H05K 7/20009 361/807 |

* cited by examiner

*Primary Examiner* — Mukundbhai G Patel
(74) *Attorney, Agent, or Firm* — Dergosits & Noah LLP; Todd A. Noah

(57) ABSTRACT

An apparatus and method are provided to facilitate the cooling of different configurations of cards within a chassis, e.g., a card riser cage. Embodiments disclose telescoping air dams that may be reconfigured to adapt to different combinations of half height and full height cards to fill vacancies in the chassis, hindering the flow of air through those vacancies, thereby redirecting the flow elsewhere and improving the cooling of the cards. By being reconfigurable, embodiments improve the ease that card cages may be reconfigured by reducing the number of parts necessary for such reconfigurations.

20 Claims, 19 Drawing Sheets

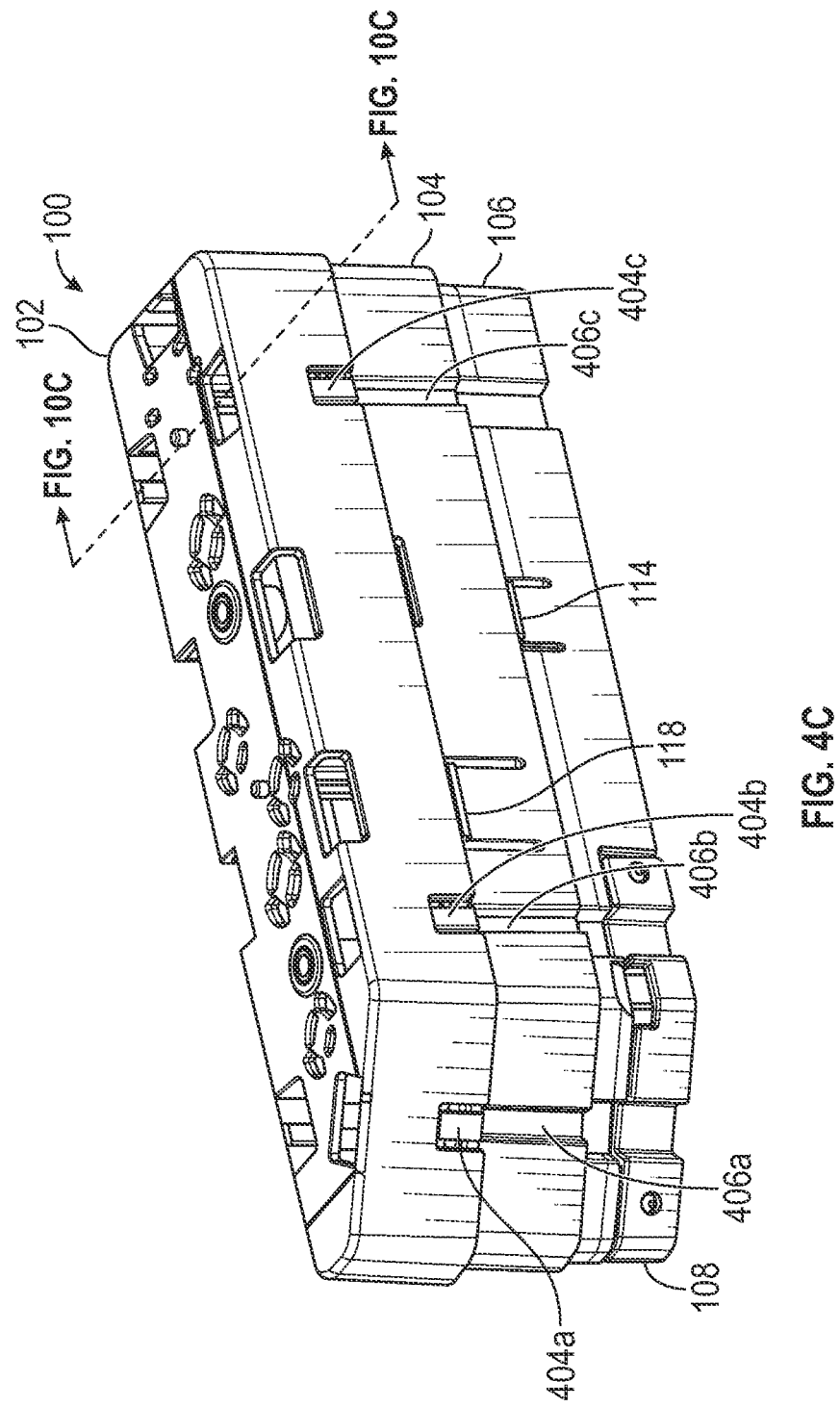

TELESCOPING AIR DAM

BACKGROUND

Typically, the cooling package for a system with multiple card configurations needs to be able to address the different card needs while facilitating factory implementation and ease of adjustability. For example, with a three slot PCI riser cage, and the associated potential combinations of half height and full height cards, it is not practical to create individual air blockers for each card layout because of tooling costs, increased part stocking counts, and BOM impact.

Thus, what is needed is an air dam that may be adapted to work with combinations of half height and full height cards.

BRIEF DESCRIPTION OF THE DRAWINGS

The embodiments are illustrated by way of example and not limitation in the accompanying drawings, in which like references indicate similar elements, and in which:

FIG. 4A, FIG. 4B, and FIG. 4C are isometric views of the embodiment of a telescoping air dam of FIG. 2 in different configurations;

DETAILED DESCRIPTION

Embodiments described within disclose telescoping air dams that may be reconfigured to work with combinations of half height and full height cards to fill vacancies in the chassis, hindering the flow of air through those vacancies. Thus, embodiments improve the cooling of the half height and full height cards by blocking a large part of a route that would otherwise allow the airflow to bypass those vacancies.

In embodiments, the telescoping air dam includes multiple tiers that may be telescoped with respect to each other to adapt to differently-sized vacancies created by the use of different HH and FH card combinations in a chassis, e.g., a card riser cage.

In an embodiment, three tiers may be nested with each tier being biased toward an extended position by a compressed spring between it and the tier in which it is nested. Thus, this embodiment may, in a fully compressed state (fully nested), may be used to fill a half-card vacancy left when a 3-slot card riser cage is provisioned with one HH card and two FH cards. are inserted into the 3-slot card riser cage. In this embodiment, releasing a latch allows the innermost tier to extend, which configures the dam to fill the two half-card vacancies left when the 3-slot card riser cage is provisional with two HH cards and one FH card. Releasing a second latch allows the middle tier to extend, which configures the dam to fill the three half-card vacancies left when the 3-slot card riser cage is provisional with three HH cards.

In an embodiment, an additional tier may be provided, which may be extended to fill more space and adapt the air dam to different configurations of the FH card or motherboard beneath the air dam. That is, the additional tier may be extended to fill additional vacant space. In an embodiment, the additional tier may extend to a lesser extent than the other tiers.

Embodiments generally provide the ability to be configured to fill vacancies left in the card rise cage by different configurations of HHHL (half height, half length) and FHHL (full height, half length) PCIe cards. Thus, a single air dam is reconfigurable to work for multiple card configurations. With the ability to reconfigure a single air dam, a card riser cage may be upgraded, e.g., from HHHL to FHHL cards, in the field and the air dam reconfigured to adapt to the new card configuration. In this manner, embodiments reduce the number of additional parts needed for such an upgrade. Furthermore, embodiments allow HHHL and FHHL cards in the lower slots of the card riser cage to be removed from the riser cage, without having to remove the embodiment, by manipulating the height of the embodiments.

An additional feature of embodiments is that each tier is individually spring biased to automatically extend upon release of a latch. Each tier may also be individually compressed back into the nested position. Both of these facilitate the reconfiguration of the air dam.

Figure 1A:
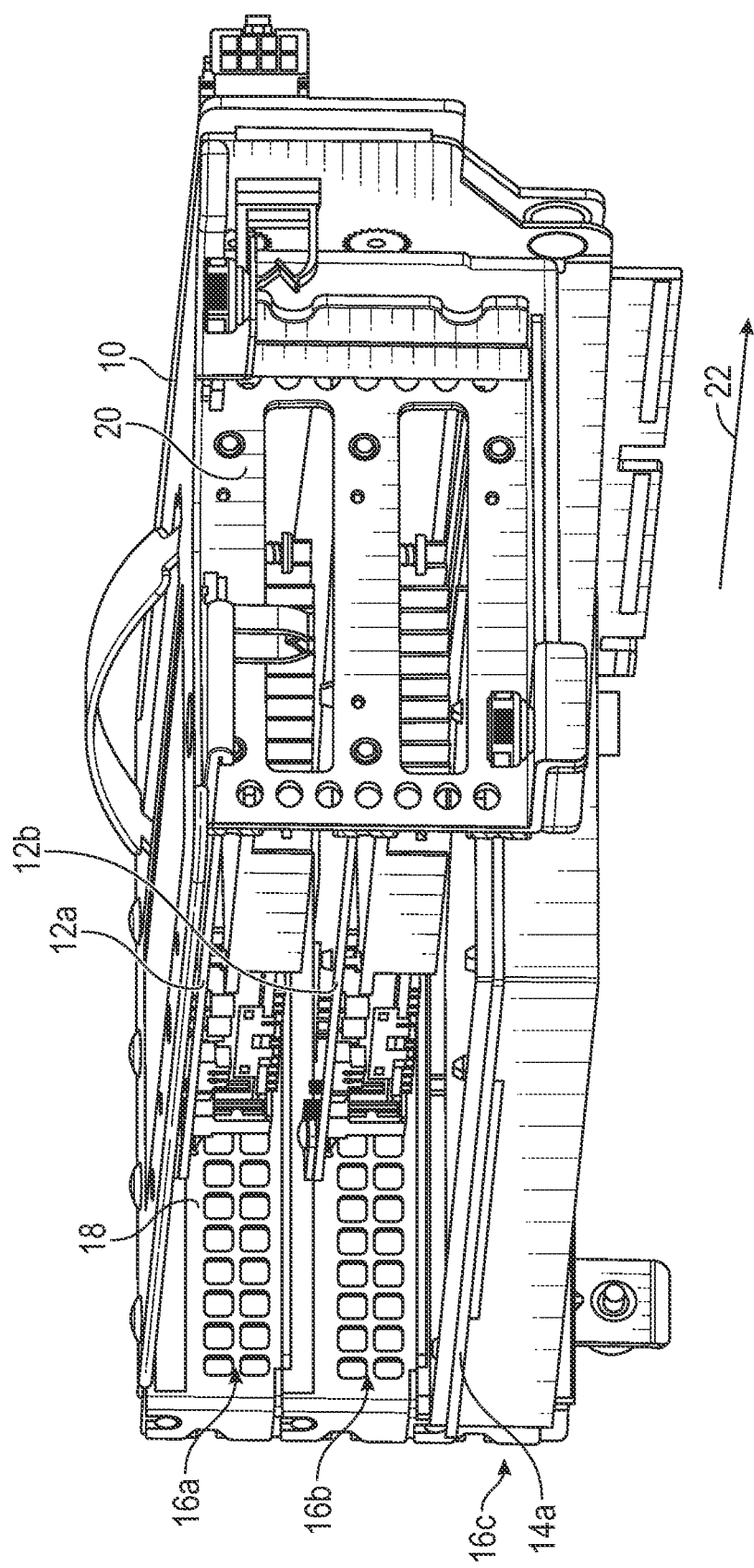
FIG. 1A, FIG. 1B, and FIG. 1C are isometric views of a prior art three-slot PCI riser cage provided with different combinations of half-height (HH) and full-height (FH) cards.
Figure 1B:
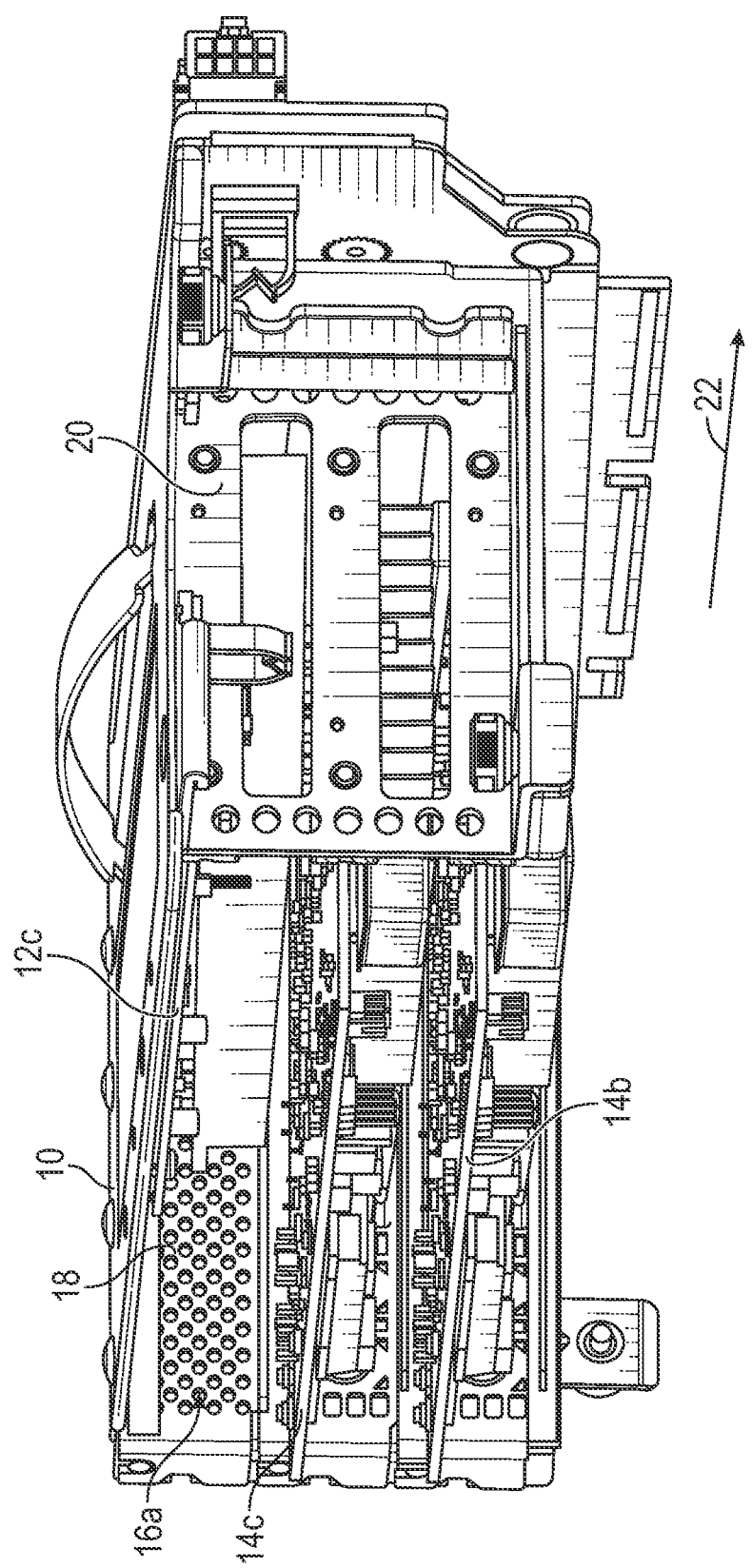
Figure 1C:
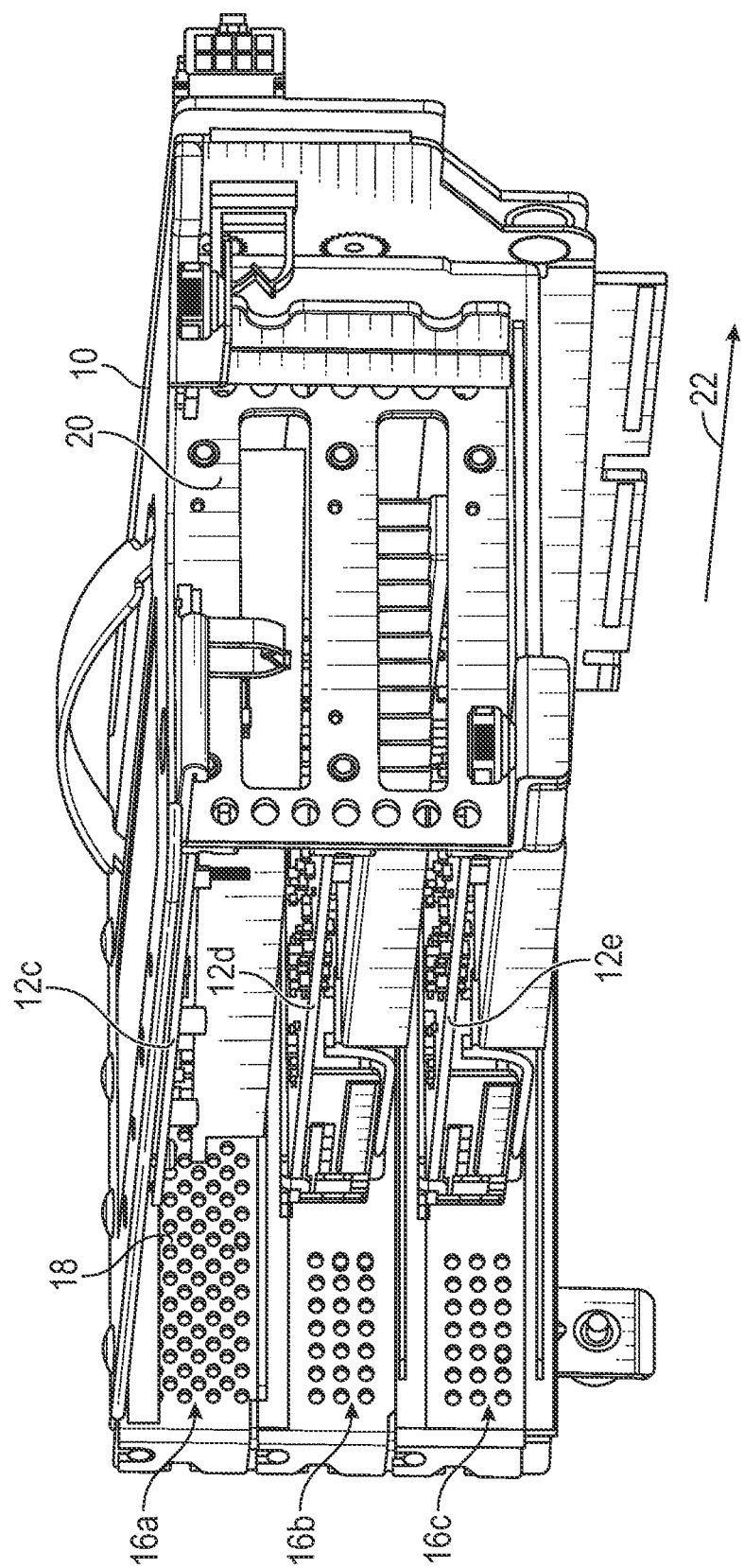

FIG. 1A, FIG. 1B, and FIG. 1C are isometric views of a prior art three-slot PCI riser cage 10 provided with different combinations of half-height (HH) and full-height (FH) cards. FIG. 1A-FIG. 1C illustrate differently-sized vacant spaces that are left in riser card cage 10 by the use of different combinations of HH and FH cards.

In FIG. 1A, riser cage 10 includes a perforated face 18 and a perforated face 20 that provide a flow path for air to flow in a direction 22 over a HHHL card 12a in a first slot 16a, a HHHL card 12b in a second slot 16b, and a FHHL card 14a in a third slot 16c. In slots 16a, 16b, since HHHL cards 12a and 12b only fill approximately half the slot, two half-slot spaces are left vacant. This first vacancy provides a flow path between faces 18 and 20 that has relatively less resistance than flow paths that go over and through HHHL cards 12a, 12b and FHHL card 14a. Thus, the cooling efficacy of the air flow over all cards in the riser card cage is diminished by the vacancy.

In FIG. 1B, riser cage 10 includes a HHHL card 12c (that is slightly different from HHHL card 12a) in first slot 16a, a FHHL card 14c in second slot 16b, and a FHHL card 14b (that is slightly different from FHHL card 14a) in third slot 16c. In slot 16a, since HHHL card 12a only fills approximately half the slot, a half-slot space is left vacant. As in FIG. 1A, this second vacancy provides a flow path between faces 18 and 20 that has relatively less resistance than flow paths that go over the HHHL and FHHL cards and, therefore, the cooling efficacy of the air flow is diminished by the vacant space.

In FIG. 1C, riser cage 10 includes three HHHL cards 12c, 12d, and 12e, leaving three half-slot spaces vacant. As in FIG. 1A, this third vacancy provides a flow path between faces 18 and 20 that has relatively less resistance than flow paths that go over the HHHL cards and, therefore, the cooling efficacy of the air flow is diminished by the third vacancy.

Typically, a different dam would be required to fill the different vacancies of FIG. 1A-FIG. 1C. Also, typically, once a dam is installed in a riser card cage, an HHHL card may not be removed without removing the dam.

Figure 2:
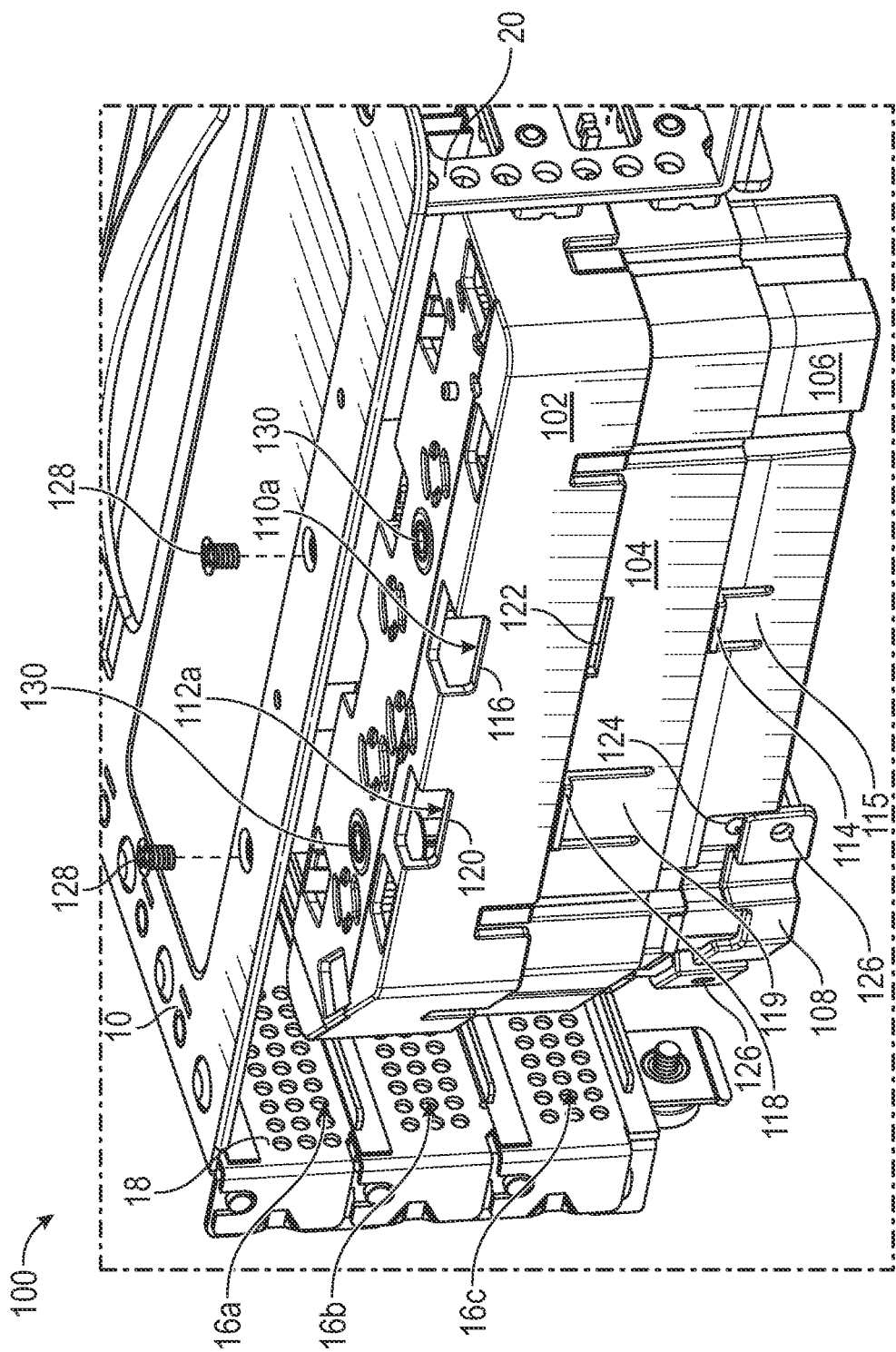
FIG. 2 is an isometric view of the prior art three-slot PCI riser cage of FIG. 1A provided with an embodiment of a telescoping air dam.

FIG. 2 is an isometric view of the three-slot PCI riser cage of FIG. 1A provided with an embodiment of a telescoping air dam. In FIG. 2, telescoping air dam 100 is connected to riser cage 10 using fasteners 128 which are receiving by nuts 130. Air dam 100 includes a first tier 102, a second tier 104, and a third tier 106. Air dam 100 is shown with tiers 102, 104, 106 fully extended (down, in the figure), which results air dam 100 corresponding in height to the combined height of slots 16a, 16b, 16c. An optional, additional tier 108 may be further extended should the configuration of riser card cage 10 below air dam 100 allow.

From the fully extended configuration of FIG. 2, air dam 100 may be fully compressed, with tier 106 nesting within tier 104, and tier 104 nesting within tier 102. In the fully compressed configuration, air dam 100 corresponds in height to slot 16a. In a partially compressed configuration, air dam 100 corresponds in height to the combination of slots 16a and 16b. The partially compressed configuration may be achieved by either compressing tier 106 into tier 104, or by compressing tier 104 into tier 102 (and leaving tier 106 extended).

Figure 4A:
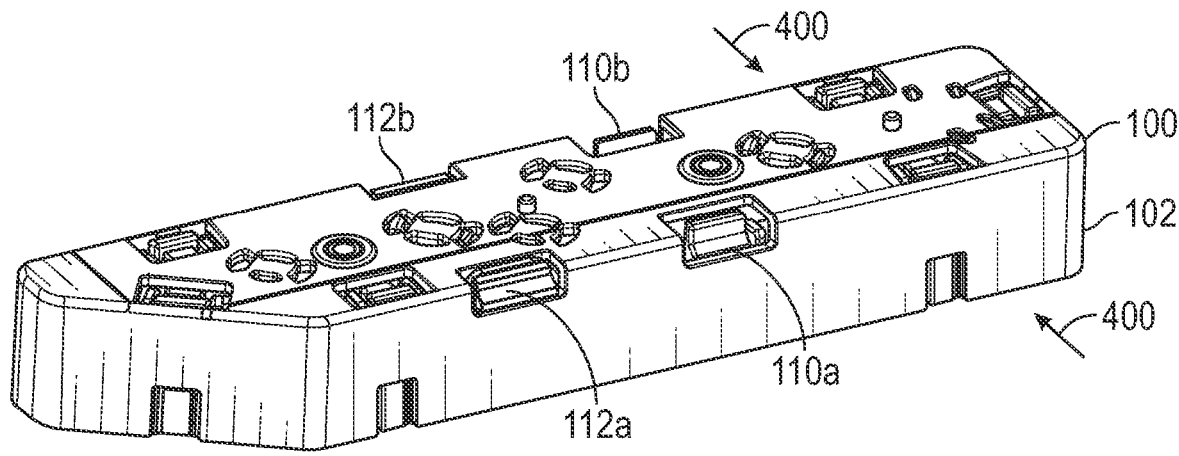

In the embodiment, air dam 100 includes latches 110a and 110b (FIG. 4A) and latches 112a and 112b (FIG. 4A). Latch 110a (latch 110b is a mirror of latch 110a) includes a catch 114 at the end of a leaf spring 115, and a striker 122. When tier 106 is compressed sufficiently into tier 104, catch 114 engages striker 122, which retains tier 106 in the retracted position. Similarly, latch 112a (latch 112b is a mirror of latch 112a) includes a catch 118 at the end of a leaf spring 119, and a striker 120. When tier 104 is compressed sufficiently into tier 104, catch 118 engages striker 120, which retains tier 104 in the retracted position.

To release latches 110a, tier 102 includes a window 116, which provides access to catch 114 when tiers 106, 104 are fully compressed. Thus, when fully compressed, air dam 100 may be reconfigured to the partially extended configuration by releasing either latches 110a, 110b (which extends tier 106), or by releasing latches 112a, 112b (which extends tier 104). When fully compressed, air dam 100 may be reconfigured to the fully extended configuration by first releasing latches 110a, 110b, and then releasing latches 112a, 112b.

In an embodiment, optional additional tier 108 may extend from tier 106. Tier 108 may be retained in a retracted position by protrusions 124 on tier 106 engaging voids 126 within tier 108. With sufficient force, the engaging force may be overcome and tier 108 extended from tier 106.

The discussion of an air dam with three tiers is merely exemplary. One of skill will understand that embodiments with two tiers and four or more tiers may be created by extending the teachings of FIGS. 2-10 to fewer or more tiers. Thus, embodiments with two or more tiers are within the scope of this disclosure, and this disclosure should not be understood as being limited to an air dam of only three tiers.

Similarly, the nesting arrangement of the lower tier being received within the upper tier is also exemplary. One of skill will understand that embodiments may reverse the nesting such that an upper tier nests within a lower tier.

Figure 3:
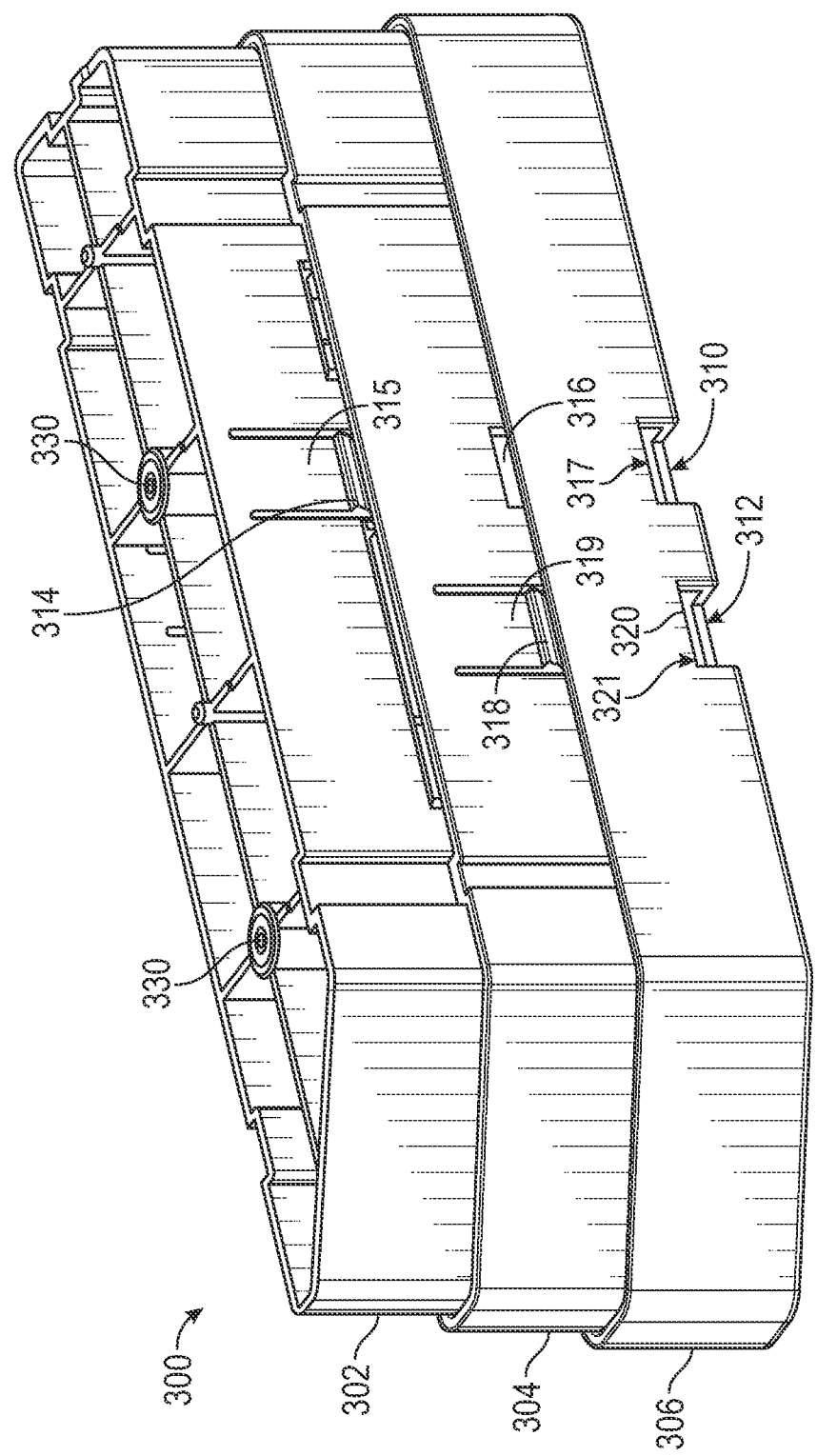
FIG. 3 is an isometric view of an embodiment of a telescoping air dam.

FIG. 3 is an isometric view of an embodiment of a telescoping air dam 300 in which the nesting is reversed. That is, in air dam 300, an upper tier 302 nests within a middle tier 304, which nests within a lower tier 306. Telescoping air dam 300 may be connected in the location within riser cage 10 as air dam 100 using fasteners 128 received by nuts 330. Air dam 300 is shown with tiers 302, 304, 306 fully extended (down, in the figure), which results air dam 300 corresponding in height to the combined height of slots 16a, 16b, 16c. From the fully extended configuration of FIG. 3, air dam 300 may be fully compressed, with tier 302 nesting within tier 304, and tier 304 nesting within tier 306. In the fully compressed configuration, air dam 300 corresponds in height to slot 16a. In a partially compressed configuration, air dam 300 corresponds in height to the combination of slots 16a and 16b. The partially compressed configuration may be achieved by either compressing tier 302 into tier 304, or by compressing tier 304 into tier 306 (and leaving tier 302 extended).

In the embodiment, air dam 300 includes latches 310 and 312. As with air dam 100, air dam 300 includes latches that are mirror image versions of latches 310, 312 on the obscured side of air dam 300. Latch 310 includes a catch 314 at the end of a leaf spring 315, and a striker 316. When tier 302 is compressed sufficiently into tier 304, catch 314 engages striker 316, which retains tier 302 in the retracted position. Similarly, latch 312 includes a catch 318 at the end of a leaf spring 319, and a striker 320. When tier 304 is compressed sufficiently into tier 306, catch 318 engages striker 320, which retains tier 306 in the retracted position.

To release latches 310, tier 306 includes a window 317, which provides access to catch 314 when tiers 306, 304 are fully compressed. A window 321 provides access to catch 318. When fully compressed, air dam 300 may be reconfigured to the partially extended configuration by releasing either latches 310 (which extends tiers 304 and 306), or by releasing latches 312 (which extends tier 306). When fully compressed, air dam 300 may be reconfigured to the fully extended configuration by first releasing latches 310, and then releasing latches 312.

Thus, in FIG. 2 and FIG. 3, illustrate two air dam embodiments that are similar in design and function. Air dam 100 has latching features on the top surface and air dam 300 has latching features on the bottom surface. A feature of air dam 300 is that the latch location enables adjustment of airduct without removal from riser cage 10.

Figure 4B:
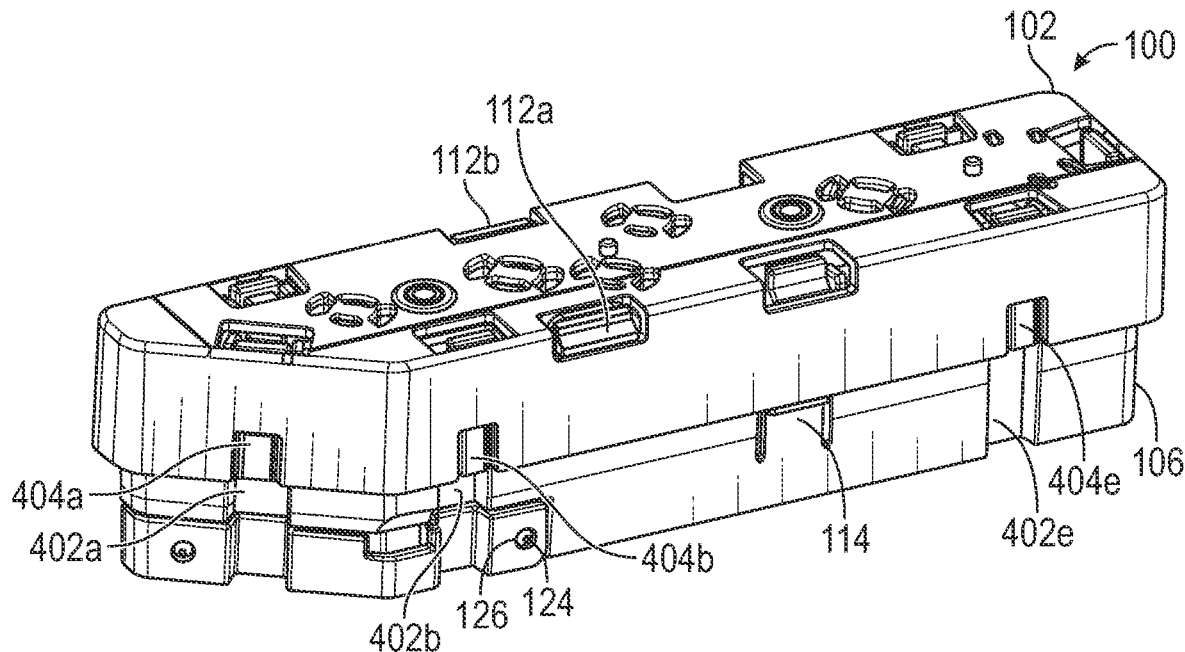

FIG. 4A, FIG. 4B, and FIG. 4C are isometric views of the embodiment of a telescoping air dam of FIG. 2 in different configurations.

In FIG. 4A, air dam 100 is in the fully compressed configuration. Latches 110a, 110b, and 112a, 112b are pressed inward, in direction 400, to release them.

In embodiments, air dam 300 of FIG. 3 also has a similar fully compressed configuration with latches 310 retaining tier 302 within tier 304 and latches 312 retaining tier 304 within tier 306.

Figure 9:
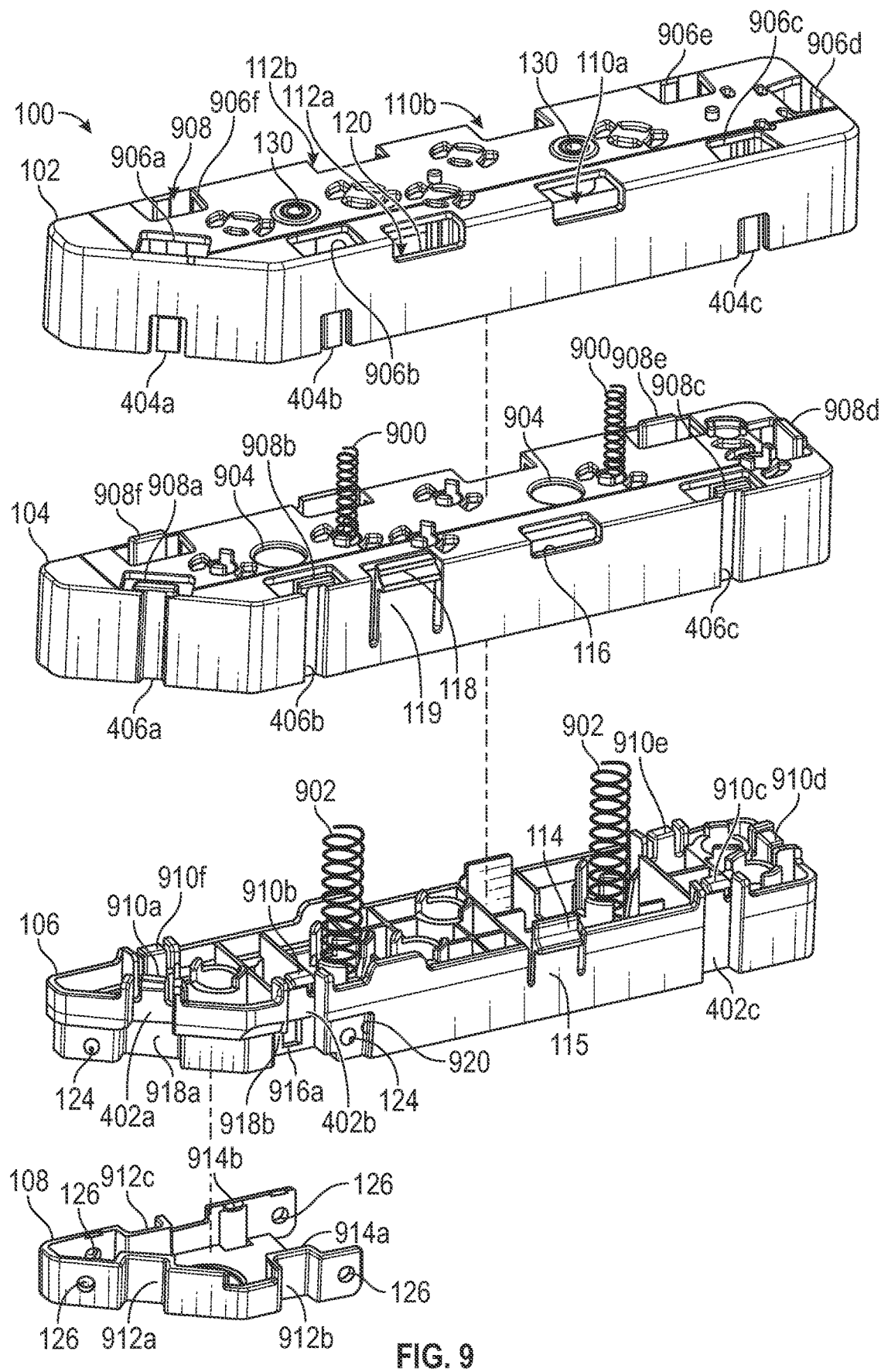
FIG. 9 is an expanded view of the embodiment of a telescoping air dam of FIG. 2.

In FIG. 4B, air dam 100 is in a partially extended configuration with tier 106 extending below tiers 102 and 104. Tier 106 extends from tier 104, after latches 110a, 110b have been released, due to the force of springs 902 (FIG. 9). The extension of tier 106 from within tier 104 is guided by telescoping nested tracks 402a . . . 402c and 406a . . . 406c (FIG. 4C) sliding with respect to each other.

In embodiments, air dam 300 of FIG. 3 also has similar partially compressed configurations with latches 310 retaining tier 302 within tier 304 or latches 312 retaining tier 304 within tier 306.

In FIG. 4C, air dam 100 is in a fully extended configuration with tier 104 now extended below tier 102, and tier 106 remaining extended below tier 104. Tier 104 extends from tier 102, after latches 112a, 112b have been released, due to the force of springs 900 (FIG. 9). The extension of tier 104 from within tier 102 is guided by telescoping nested tracks 404a . . . 404c and 406a . . . 406c sliding with respect to each other. Additional telescoping nested tracks similar to 402a . . . 402c, 404a . . . 404c, and 406a . . . 406c are included on the obscured sides of air dam 100 in tiers 102, 104, and 106 in the locations corresponding to telescoping nested tracks 906d . . . 906f (FIG. 9).

In embodiments, air dam 300 of FIG. 3 also has a fully extended configuration with both latches 310 and latches 312 released, as shown in FIG. 3.

In the fully compressed configurations, air dams 100 and 300 may be use to occupy most of the space left vacant in riser cage 10 when an HHHL card is occupying slot 16a and FHHL cards are occupying slots 16b and 16c. In the partially compressed configurations, air dams 100 and 300 may be use to occupy most of the space left vacant in riser cage 10 when HHHL cards are occupying slots 16a and 16b and a FHHL card is occupying slot 16c. In the fully extended configurations, air dams 100 and 300 may be use to occupy most of the space left vacant in riser cage 10 when HHHL cards are occupying slots 16a, 16b, and 16c.

Figure 5A:
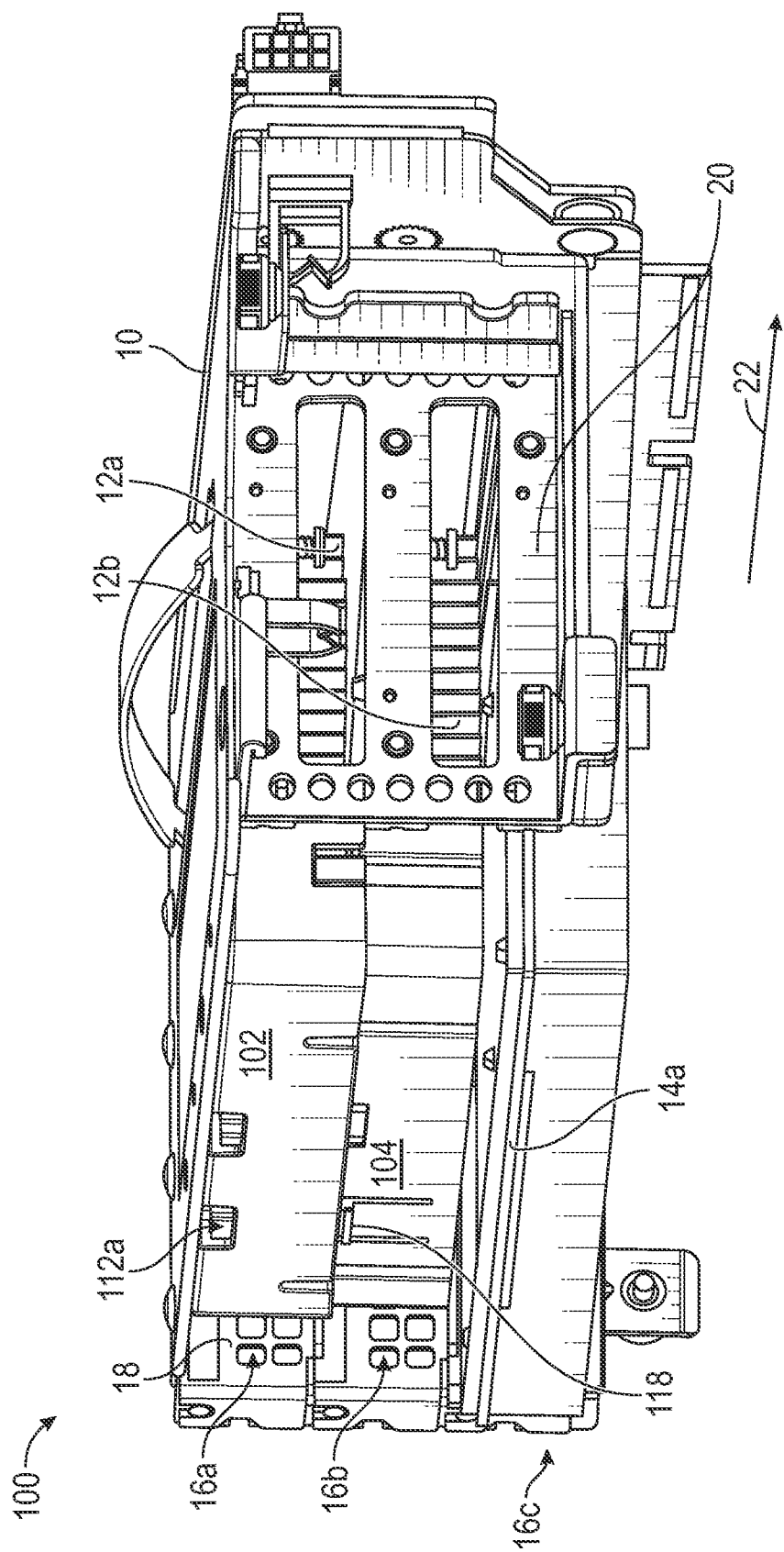
FIG. 5A, FIG. 5B, and FIG. 5C are isometric views of the prior art three-slot PCI riser cage of FIG. 1A provided with the embodiment of a telescoping air dam of FIG. 2 in different configurations.
Figure 5B:
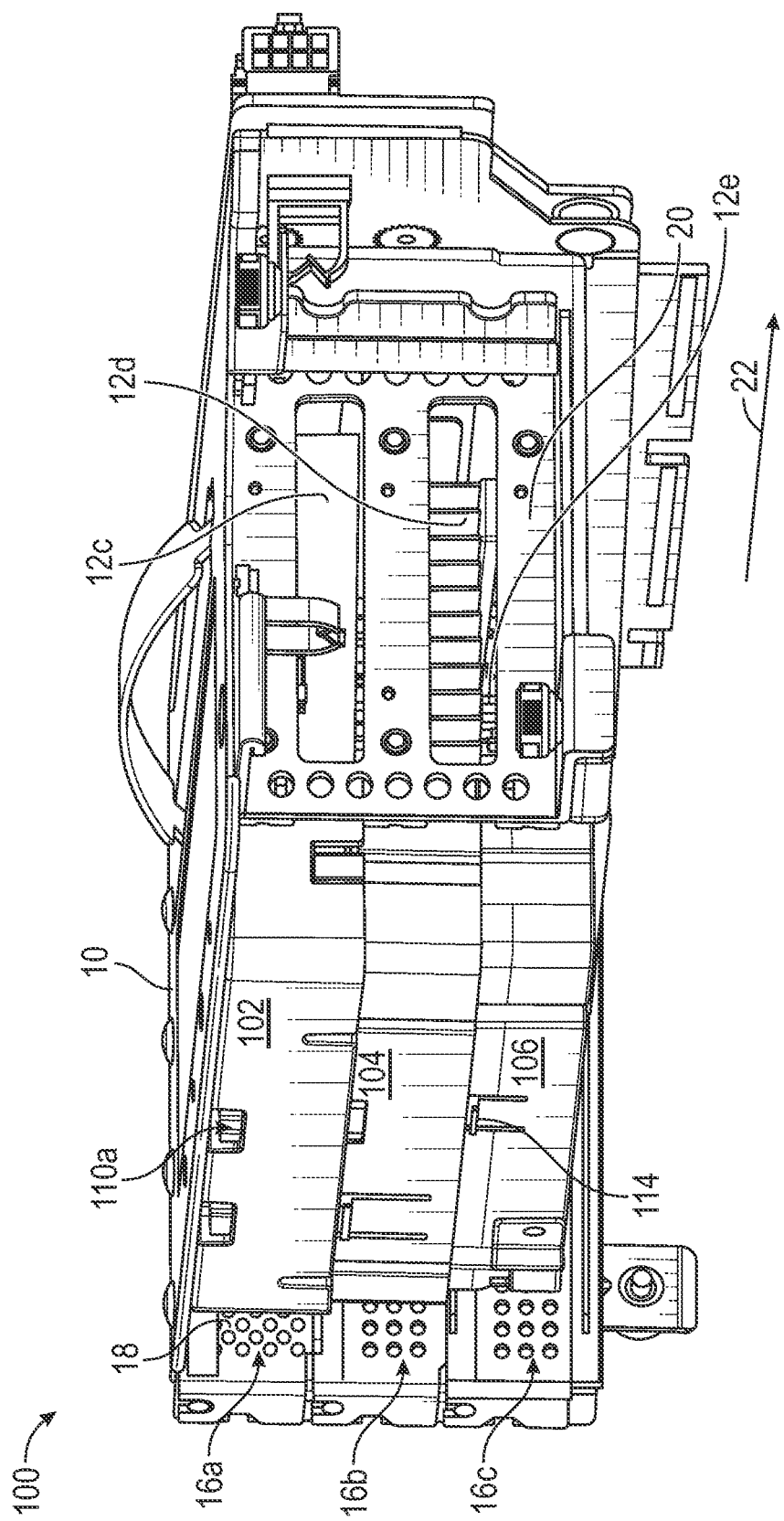
Figure 5C:
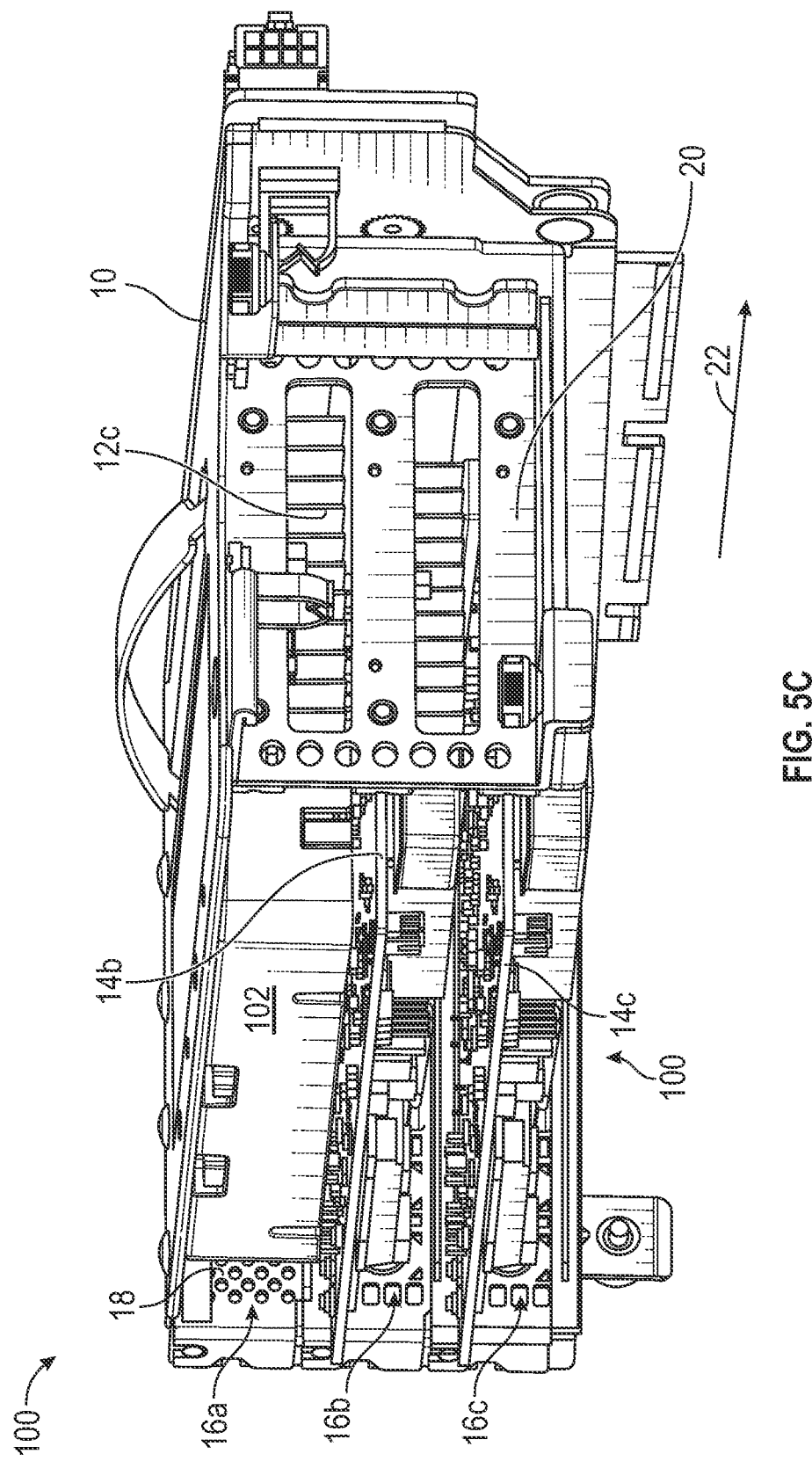

FIG. 5A, FIG. 5B, and FIG. 5C are isometric views of the prior art three-slot PCI riser cage of FIG. 1A provided with the embodiment of a telescoping air dam of FIG. 2 in different configurations.

In FIG. 5A, air dam 100 is configured to be partially extended with tier 104 extended from tier 102 (after latches 112 have been released). Air dam 100 is shown occupying space in slots 16a and 16b next to HHHL cards 12a, 12b, and above FHHL card 14a. Thus, air dam 100 impedes the flow of air in direction 22 through riser cage 10 by occupying what would otherwise be vacant space the height of two slots and the width of a half card. In embodiments, air dam 300 may be similarly configured and positioned.

In FIG. 5B, air dam 100 is configured to be fully extended with tier 104 extended from tier 102 and tier 106 extended from tier 104 (after latches 110 have been released). Air dam 100 is shown occupying space in slots 16a, 16b, and 16c next to HHHL cards 12c, 12d, and 12e. Thus, air dam 100 impedes the flow of air in direction 22 through riser cage 10 by occupying what would otherwise be vacant space the height of three slots and the width of a half card. In embodiments, air dam 300 may be similarly configured and positioned.

In FIG. 5C, air dam 100 is configured to be fully compressed with tier 106 nested within tier 104, and tier 104 nested within tier 102. Air dam 100 is shown occupying space in slot 16a, next to HHHL card 12c and above FHHL card 14b. Thus, air dam 100 impedes the flow of air in direction 22 through riser cage 10 by occupying what would otherwise be vacant space the height of one slot and the width of a half card. In embodiments, air dam 300 may be similarly configured and positioned.

In embodiments, a feature of air dam 100 illustrated by FIG. 5A-FIG. 5C is that tiers 102, 104, 106 extend for substantially the entire width (direction 22) of card riser cage 10 between perforated faces 18, 20. The benefit of air dam 100 filling substantially all the volume of the vacant slot is that it increases resistance to the flow of air through that vacancy, forcing the flow elsewhere, i.e., re-directing the flow about the remaining cards where it is beneficial.

Figure 6A:
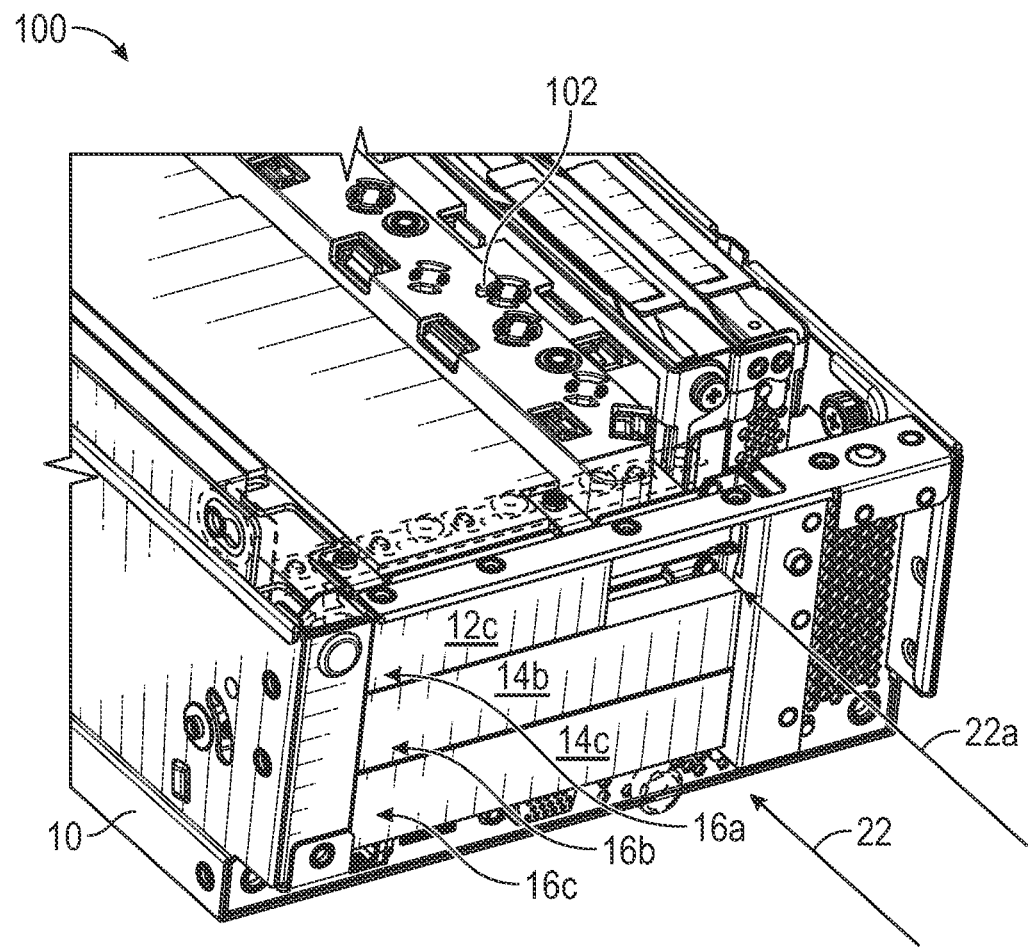
FIG. 6A is an isometric view of the prior art three-slot PCI riser cage of FIG. 1A provided with a combination of half-height (HH) and full-height (FH) cards and with the embodiment of a telescoping air dam of FIG. 2.
Figure 6B:
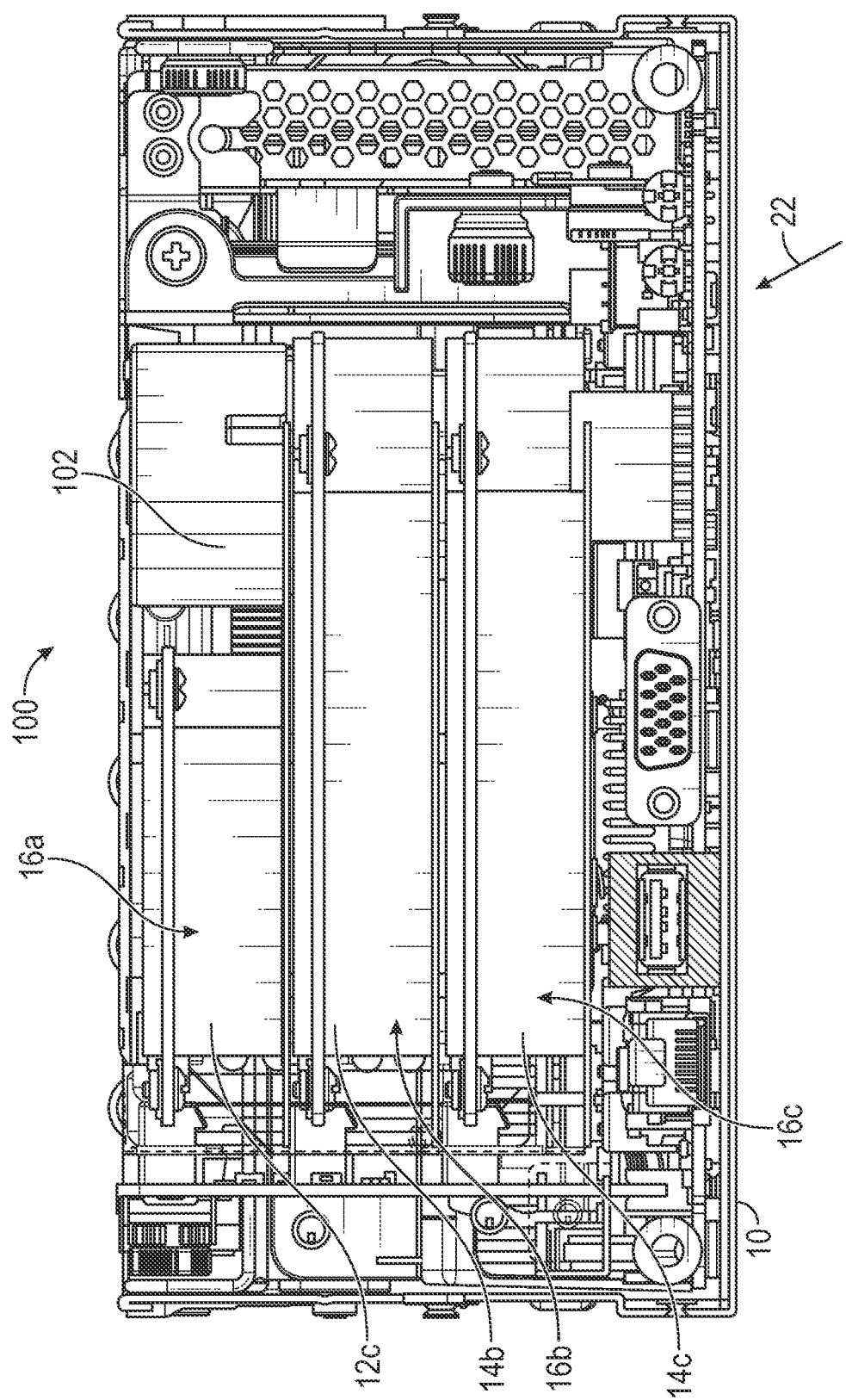
FIG. 6B is a front view of FIG. 6A.

FIG. 6A is an isometric view of the prior art three-slot PCI riser cage of FIG. 1A provided with a combination of half-height (HH) and full-height (FH) cards and with the embodiment of a telescoping air dam of FIG. 2. In FIG. 6A the upper surface of riser card cage 10 is rendered transparent to better illustrate air dam 100. FIG. 6B is a front view of FIG. 6A. FIGS. 6A and 6B illustrate that when air dam 100 is in the fully compressed configuration it may be positioned within riser card cage 10 to hinder an airflow 22a that would otherwise flow unimpeded through the half height space to the right of HHHL card 12c. Thus, air flow 22, which flows over cards 12c, 14b, and 14c is strengthened, which improves the cooling effect.

Figure 7A:
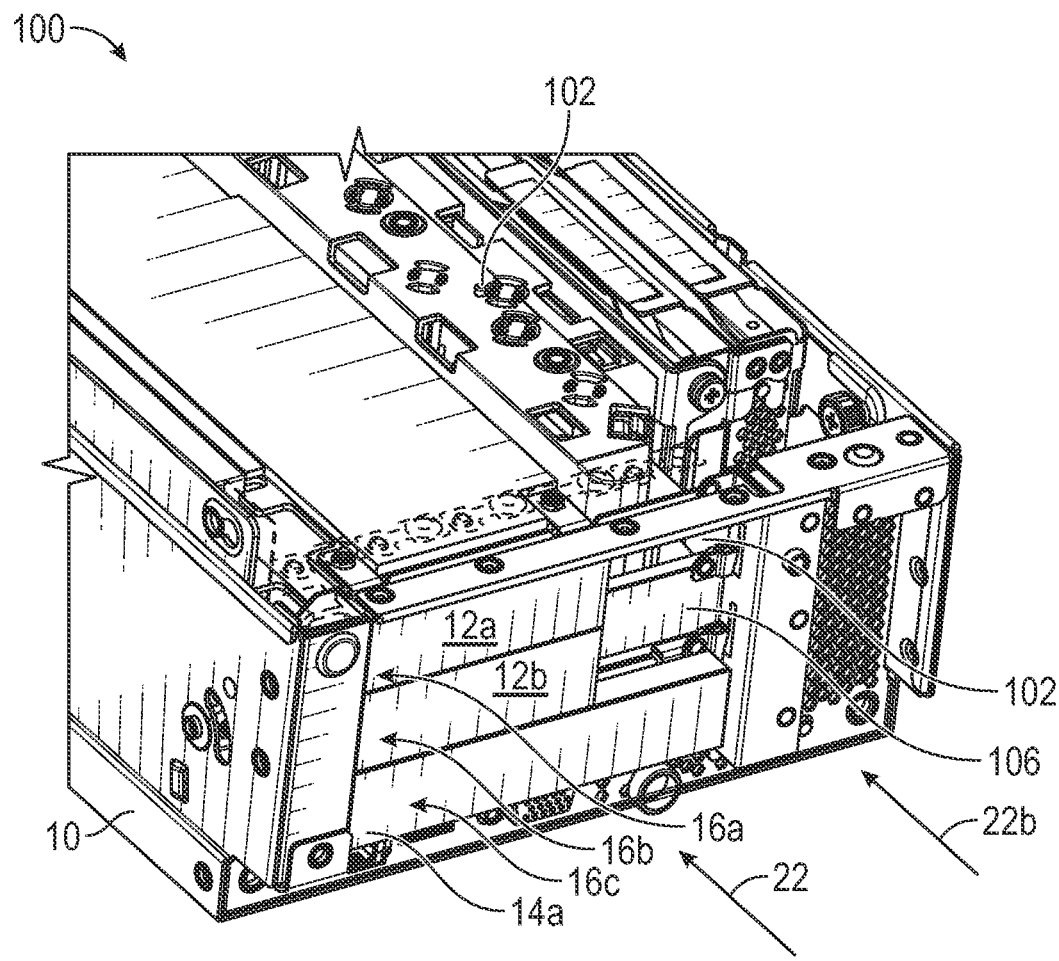
FIG. 7A is an isometric view of the prior art three-slot PCI riser cage of FIG. 1A provided with a combination of half-height (HH) and full-height (FH) cards and with the embodiment of a telescoping air dam of FIG. 2.
Figure 7B:
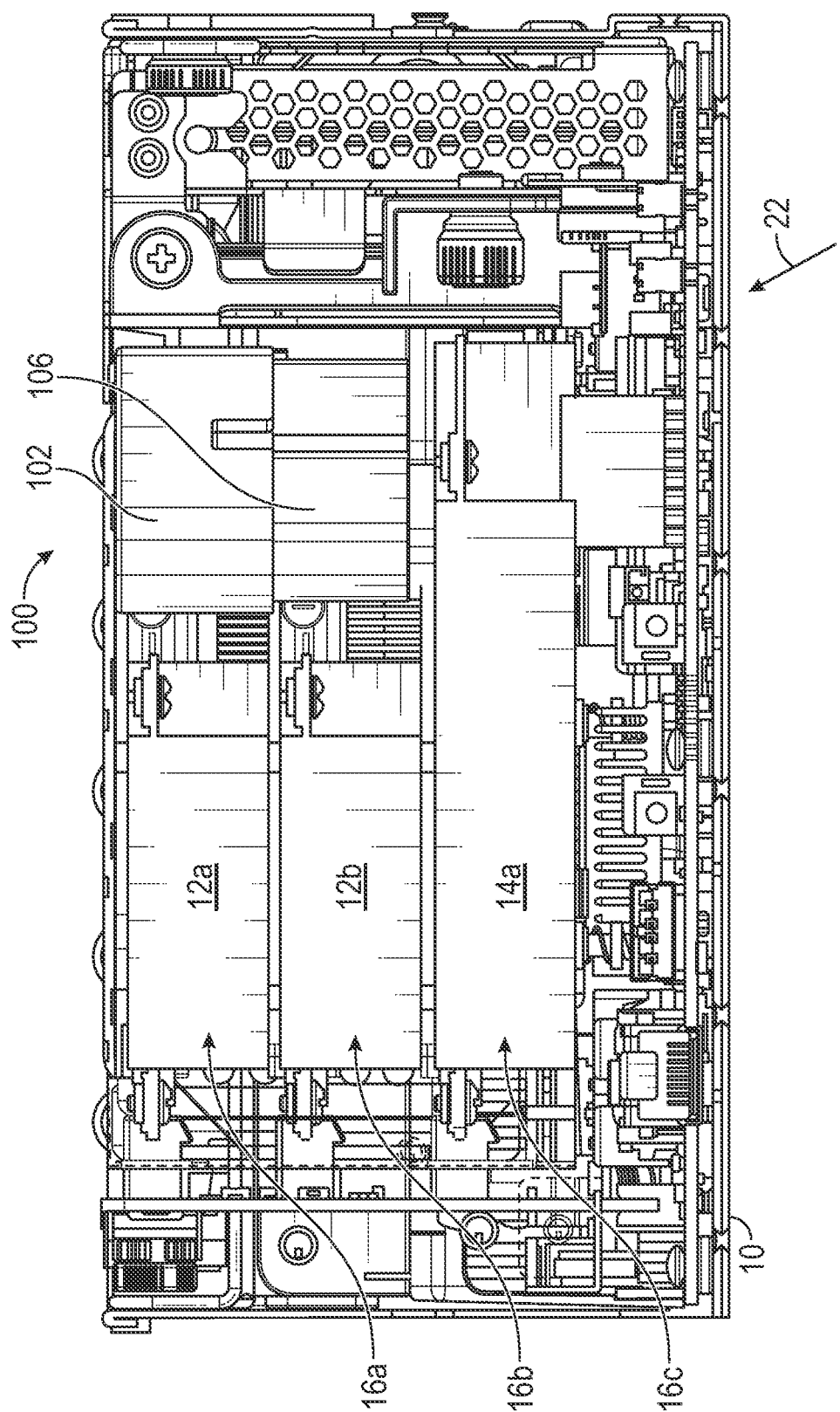
FIG. 7B is a front view of FIG. 7A.

FIG. 7A is an isometric view of the prior art three-slot PCI riser cage of FIG. 1A provided with a combination of half-height (HH) and full-height (FH) cards and with the embodiment of a telescoping air dam of FIG. 2. In FIG. 7A the upper surface of riser card cage 10 is rendered transparent to better illustrate air dam 100. FIG. 7B is a front view of FIG. 7A. FIGS. 7A and 7B illustrate that when air dam 100 is in the partially compressed configuration it may be positioned within riser card cage 10 to hinder an airflow 22b that would otherwise flow unimpeded through the half height spaces to the right of HHHL cards 12a and 12b. Thus, air flow 22, which flows over cards 12a, 12b, and 14a is strengthened, which improves the cooling effect.

Figure 8A:
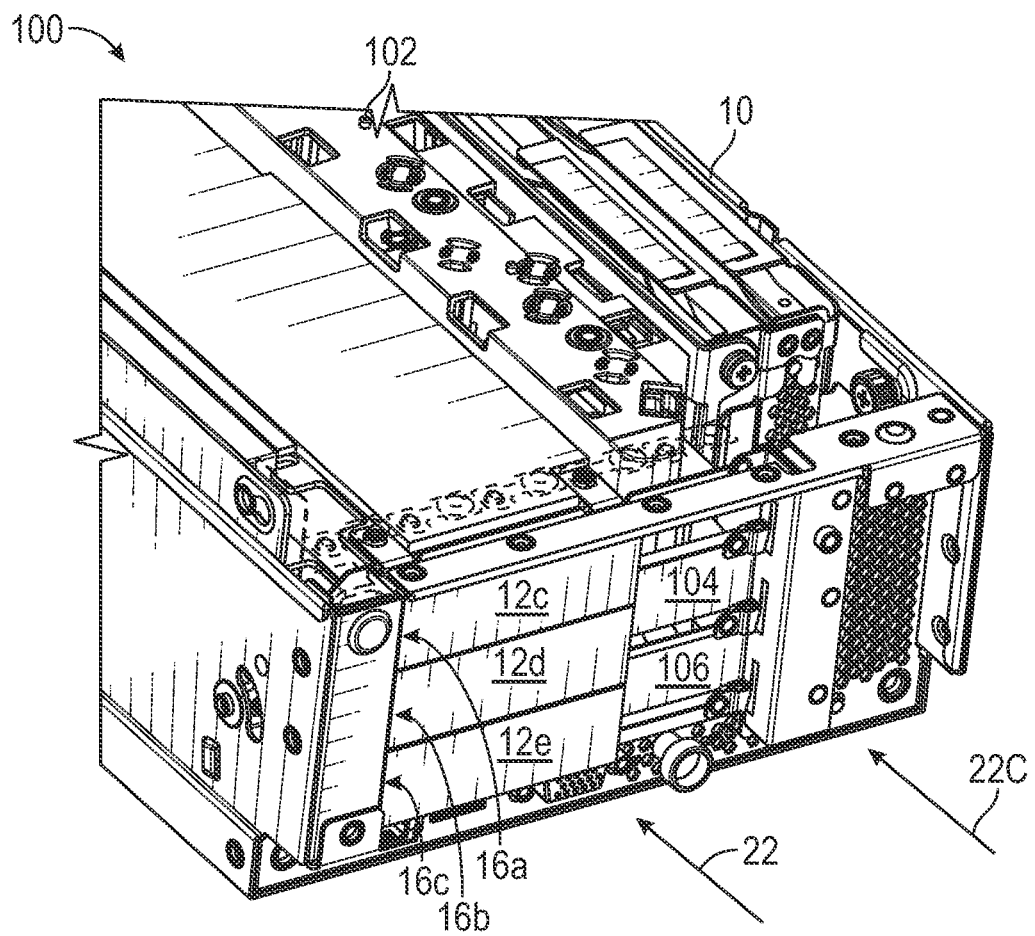
FIG. 8A is an isometric view of the prior art three-slot PCI riser cage of FIG. 1A provided with a combination of half-height (HH) and full-height (FH) cards and with the embodiment of a telescoping air dam of FIG. 2.
Figure 8B:
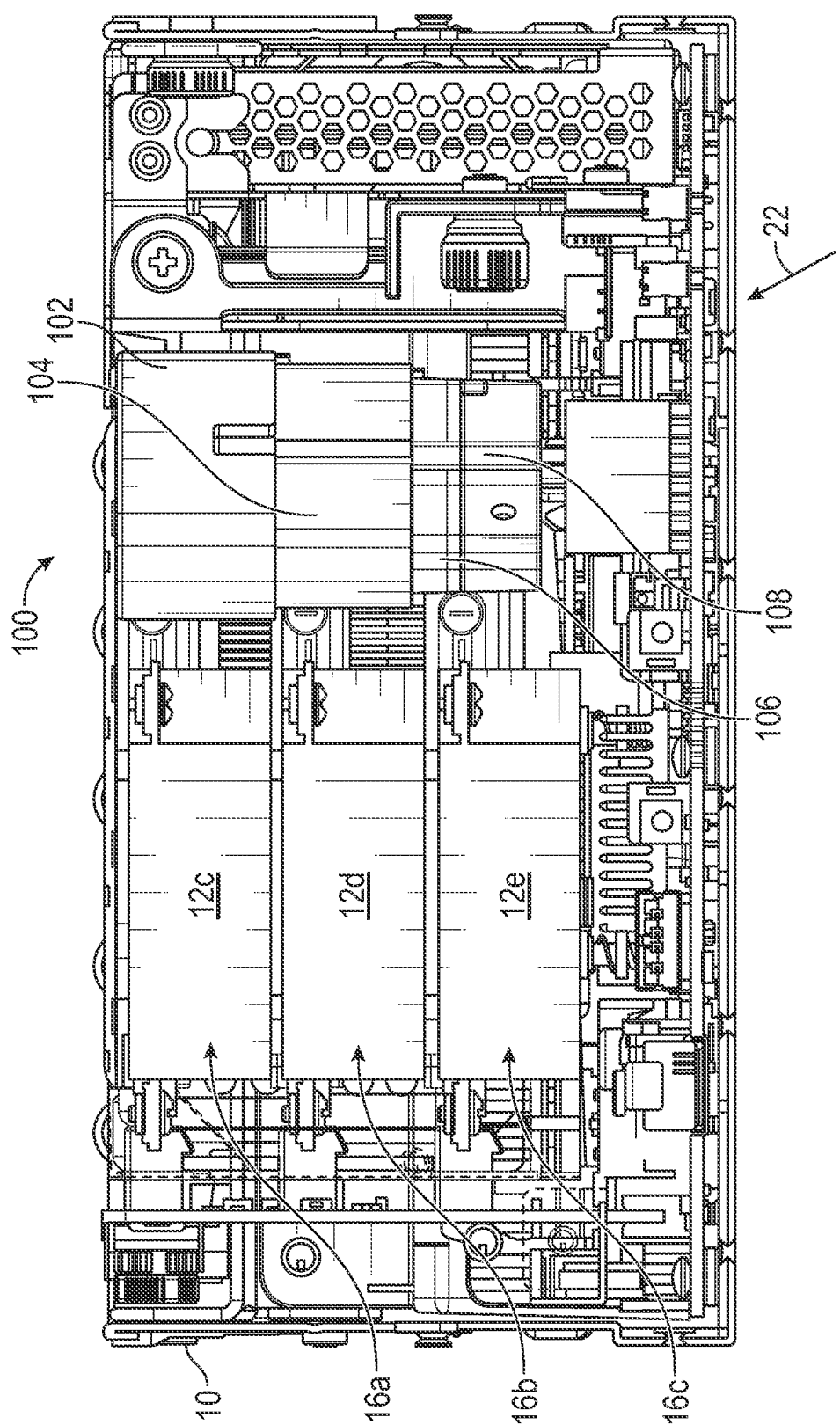
FIG. 8B is a front view of FIG. 8A.

FIG. 8A is an isometric view of the prior art three-slot PCI riser cage of FIG. 1A provided with a combination of half-height (HH) and full-height (FH) cards and with the embodiment of a telescoping air dam of FIG. 2. In FIG. 8A the upper surface of riser card cage 10 is rendered transparent to better illustrate air dam 100. FIG. 8B is a front view of FIG. 8A. FIGS. 8A and 8B illustrate that when air dam 100 is in the fully extended configuration it may be positioned within riser card cage 10 to hinder an airflow 22c that would otherwise flow unimpeded through the half height spaces to the right of HHHL cards 12c, 12d, and 12e. Thus, air flow 22, which flows over cards 12c, 12d, and 12e is strengthened, which improves the cooling effect.

In embodiments, air dam 300 of FIG. 3 may also be configured and positioned as shown in FIGS. 6A-8B to achieve the same improvement in cooling. In addition, a feature of air dam 300 is that latches 310, 312 may be accessed from below when air dam 300 is installed. Thus, air dam 300 may be reconfigured while remaining attached to riser card cage 10.

FIG. 9 is an expanded view of the embodiment of a telescoping air dam 100 of FIG. 2. Air dam 100 is shown to include springs 900, which bias tier 104 to the extended position with respect to tier 102, and springs 902, which bias tier 106 to the extended position with respect to tier 104. Tier 104 include holes 904 that admit nuts 130 when tier 104 is compressed into tier 102. As discussed earlier, air dam 100 includes telescoping nested tracks including inner tracks 906a . . . 906f in tier 102. Stops 908a . . . 908f of tracks 406a . . . 4046 slide of tier 104 slide along inner tracks 906a . . . 906f with the extension of tier 104 from tier 102. Stops 910a . . . 910f of tracks 402a . . . 402f of tier 106 slide along inner faces of tracks 406a . . . 406f with the extension of tier 106 from tier 104.

For additional tier 108, indentations 912a . . . 912c slide with respect to indentations 918a . . . 918c with the extension of tier 108 from tier 106. The travel of tier 108 is limited by teeth 914a, 914b (914a is obstructed but similar to 914b) catching edges 916a, 916b (not shown). Tier 108 may be pulled down if, e.g., board components are not present below. This allows air dam 100 to further fill the space above the board surface. With tier 108 extended, air dam 100 is at its tallest configuration.

To compress air dam 100, each section may be pushed back into the next section until the latches engage (for tiers 102, 104, 106) or until protrusions 124 are received into voids 126 (for tier 108).

In embodiments that include tier 108, tier 106 includes a recess 920 to receive tier 108 and allow the combined tiers 106, 108 to be received within tier 104.

In embodiments, springs 900, 902 may be configured to influence the order in which tiers recess. In an embodiment, springs 900 may be made stronger than springs 902 so that a compressive force applied to tier 106 seats tier 106 into tier 104 first, and then seats tier 104 into tier 102. In an embodiment, springs 902 may be made stronger than springs 900 so that a compressive force applied to tier 106 seats tier 104 into tier 102 first, and then seats tier 106 into tier 104.

Figure 10A:
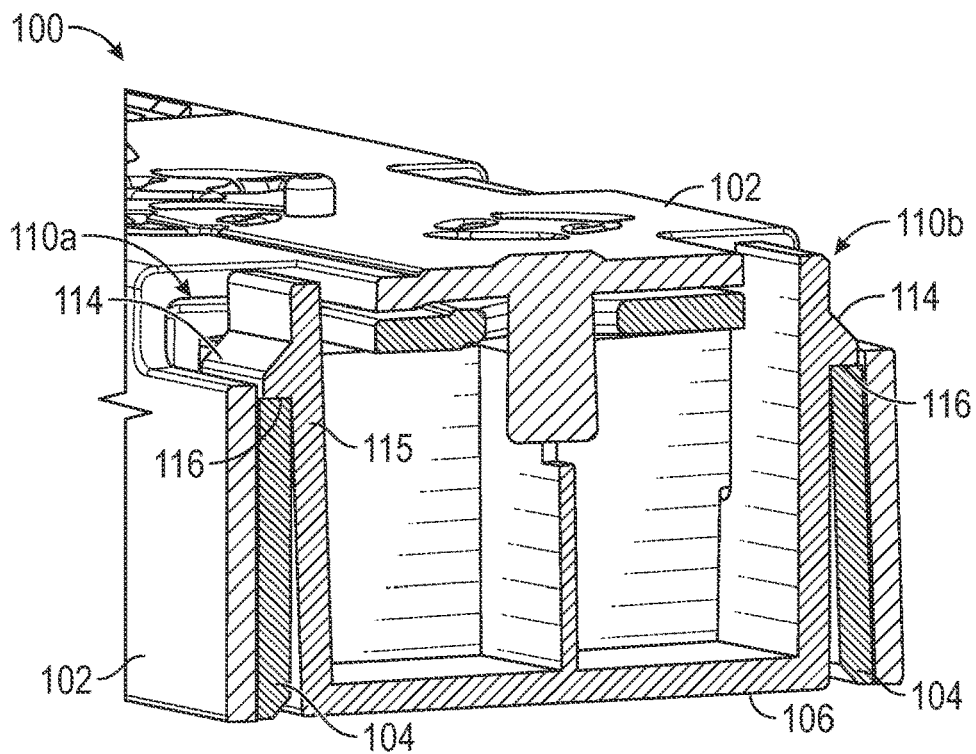
FIG. 10A is a cross-sectional view of the embodiment of a telescoping air dam as indicated in FIG. 4A.

FIG. 10A is a cross-sectional view of the embodiment of a telescoping air dam as indicated in FIG. 4A. In FIG. 10A, catches 114 are shown to engage strikers 116 to retain tier 106 within tier 104.

Figure 10B:
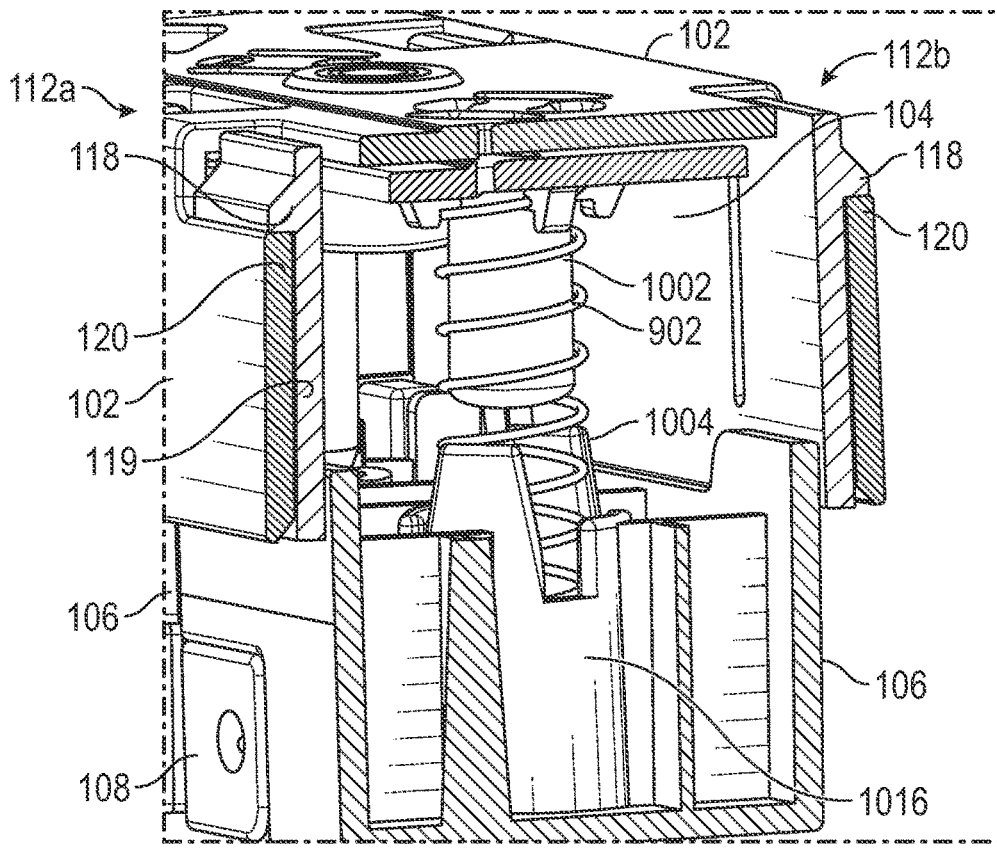
FIG. 10B is a cross-sectional view of the embodiment of a telescoping air dam as indicated in FIG. 4B.

FIG. 10B is a cross-sectional view of the embodiment of a telescoping air dam as indicated in FIG. 4B. In FIG. 10B, spring 902 is shown to be seated about a cylinder 1002 of tier 104 and seated into a recess 1016 of tier 106. On compression of tier 106 into tier 104, spring 902 is compressed further onto cylinder 1002 and into recess 1016. Also, with the compression, cylinder 1002 is at least partially received by recess 1016.

Figure 10C:
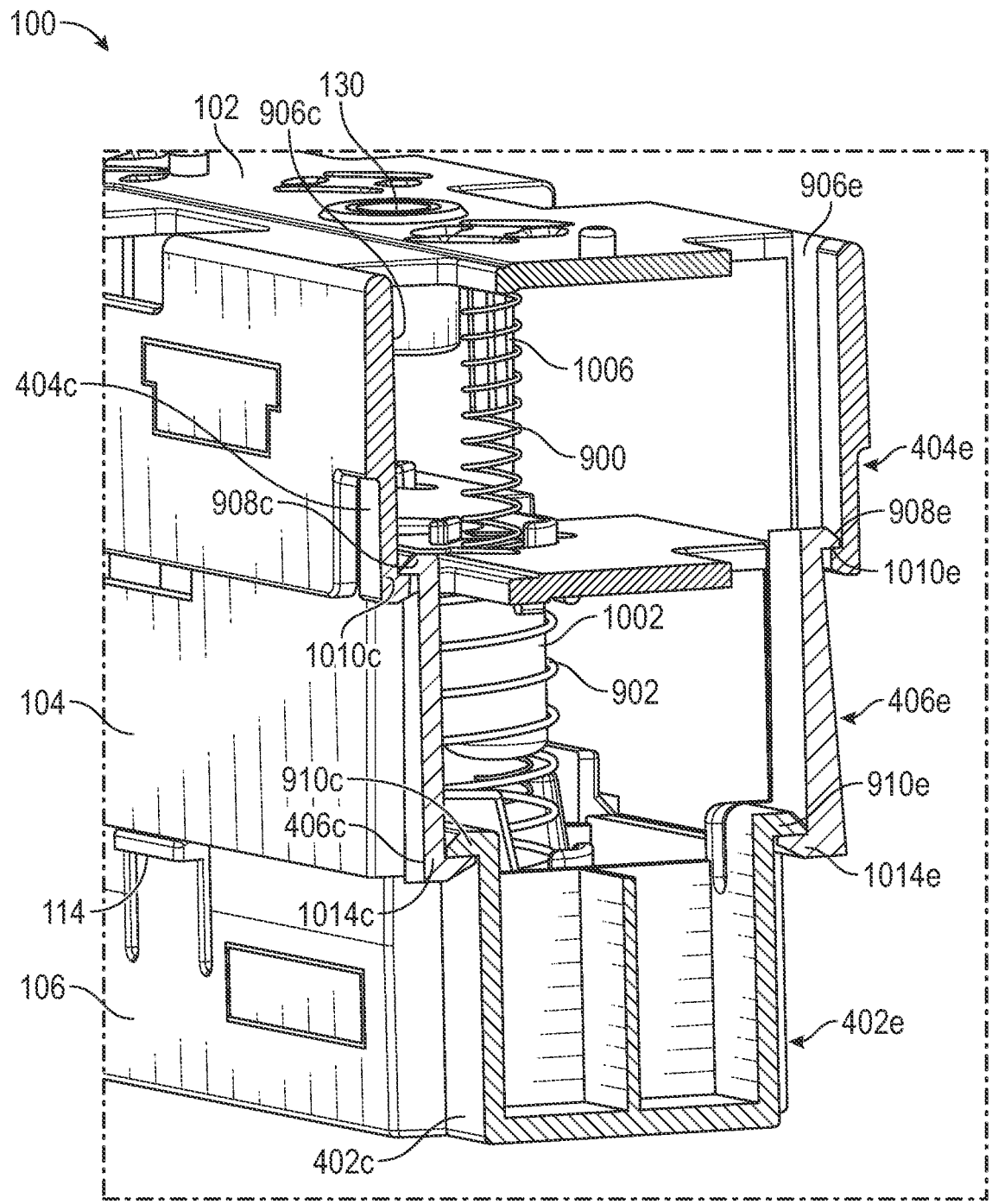
FIG. 10C is a cross-sectional view of the embodiment of a telescoping air dam as indicated in FIG. 4C.

FIG. 10C is a cross-sectional view of the embodiment of a telescoping air dam as indicated in FIG. 4C. In FIG. 10C, spring 900 is shown to be seated about a cylinder 1006 of tier 102 and seated into cylinder 1002 of tier 104. On compression of tier 104 into tier 102, spring 900 is compressed further onto cylinder 1002 and into recess 1016. Also, with the compression, cylinder 1002 is at least partially received by recess 1016.

FIG. 10C illustrates features that prevent the tiers from separating. Specifically, each nested telescoping track includes lips 1010a . . . 1010f that engage stops 908a . . . 908f and prevent tier 104 from separating from tier 102. Similarly, lips 1014a . . . 1014f engage stops 910a . . . 910f and prevent tier 106 from separating from tier 104.

In embodiments, air dam 300 of FIG. 3 includes features similar to those of air dam 100 in FIG. 9 and FIG. 10A-FIG. 10C, including the springs, telescoping nested tracks, and stops, to facilitate the extension and compression of tiers 302, 304, and 306.

The previous description is provided to enable any person skilled in the art to practice the various aspects described herein. In the embodiments, the separation of various system components in the embodiments described above should not be understood as requiring such separation in all embodiments. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

All structural and functional equivalents to the elements of the various aspects described throughout this disclosure that are known or later come to be known to those of ordinary skill in the art are expressly incorporated herein by reference and are intended to be encompassed by the claims.

What is claimed is:

1. An apparatus comprising:
    a first tier configured to accommodate a second tier in a first nested position within the first tier;
    a first latch configured to engage a first striker, the first latch and first striker maintaining the second tier nested in the first nested position when latched;
    a first travel limiter, including a first track follower engaging a first track, movement of the first track follower along the first track limiting relative movement between the first and second tiers to movement between the first nested position and a first extended position; and
    a first spring biasing the second tier to the first extended position, wherein:
    when the second tier is in the first nested position, the apparatus is configured to hinder a first flow of air through a first slot of a chassis when positioned in the first slot;
    when the first latch is released, the first spring urges the second tier to the first extended position, and the apparatus is configured to hinder the first flow of air and a second flow of air through a second slot of the chassis when positioned within the first and second slots.

2. The apparatus of claim 1, wherein the first tier and the second tier are elongate in a first direction corresponding to the first and second flows of air.

3. The apparatus of claim 1, wherein:
    a first portion of the first spring is coiled about a first cylinder;
    a second portion of the first spring is received within a first recess; and
    when the second tier is in the first nested position, an additional portion of the first spring is compressed onto the first cylinder and the first cylinder is at least partially received within the first recess.

4. The apparatus of claim 1, further including:
a third tier configured to be received within the second tier in a second nested position;
a second latch configured to engage a second striker, the second latch and second striker maintaining the third tier nested in the second nested position when latched;
a second travel limiter, including a second track follower engaging a second track, movement of the second track follower along the second track limiting relative movement between the second and third tiers to movement between the second nested position and a second extended position; and
a second spring biasing the third tier to the second extended position, wherein:
when the second latch is released, the second spring urges the third tier to the second extended position;
when the third tier is in the second extended position and the second tier is in the first extended position, the apparatus is configured to hinder the first flow of air, the second flow of air, and a third flow of air through a third slot of the chassis when positioned within the first, second, and third slots;
when the second tier is in the first extended position, or when third tier is in the second extended position, the apparatus is configured to hinder the first flow of air and the second flow of air when positioned within the first and second slots; and
when the second tier is in the first nested position and the third tier is in the second nested position, the apparatus is configured to hinder the first flow of air when positioned within the first slot.

5. The apparatus of claim 4, wherein:
a first portion of the first spring is coiled about a first cylinder;
a second portion of the first spring is received within a second cylinder;
a first portion of the second spring is coiled about the second cylinder;
when the second tier is in the first nested position, an additional portion of the first spring is compressed onto the first cylinder and the first cylinder is at least partially received within the second cylinder; and
when the third tier is in the second nested position, an additional portion of the second spring is compressed onto the second cylinder.

6. The apparatus of claim 5, wherein:
a second portion of the second spring is received within a first recess; and
when the third tier is in the second nested position, the additional portion of the second spring is compressed onto the second cylinder and the second cylinder is at least partially received within the first recess.

7. The apparatus of claim 4, further comprising:
a first window in the first tier providing access to release the first latch;
a second window in the first tier and a third window in the second tier cooperating to provide access to release the second latch, wherein:
when the second tier is in the first nested position and the third tier is in the second nested position, the first latch is accessible via the first window and the second latch via the second and third windows.

8. The apparatus of claim 7, wherein:
when the second tier is in the first extended position, the second latch is inaccessible, such that, to extend both the second tier to the first extended position and the third tier to the second extended position, the second latch is released before the first latch.

9. The apparatus of claim 4, wherein the first spring is configured have a greater spring constant than the second spring, such that, when the second tier is in the first extended position and the third tier is in the second extended position, an application of force to the third tier causes third tier to move to the second nested position before the second tier moves to the first nested position.

10. The apparatus of claim 4, wherein the second spring is configured have a greater spring constant than the first spring, such that, when the second tier is in the first extended position and the third tier is in the second extended position, an application of force to the third tier causes second tier to move to the first nested position before the third tier moves to the second nested position.

11. A method comprising:
providing a chassis including a first slot and a second slot with an apparatus including:
a first tier configured to accommodate a second tier in a first nested position within the first tier;
a first latch configured to engage a first striker, the first latch and first striker maintaining the second tier nested in the first nested position when latched;
a first travel limiter, including a first track follower engaging a first track, movement of the first track follower along the first track limiting relative movement between the first and second tiers to movement between the first nested position and a first extended position; and
a first spring biasing the second tier to the first extended position, wherein:
when the second tier is in the first nested position, the apparatus is configured to hinder a first flow of air through the first slot of the chassis when positioned in the first slot;
when the first latch is released, the first spring urges the second tier to the first extended position, and the apparatus is configured to hinder the first flow of air and a second flow of air through the second slot of the chassis when positioned within the first and second slots;
when the first slot is at least partially vacant and the second slot is occupied: configuring the apparatus such that the second tier is in the first nested position and positioning the apparatus within the first slot to hinder the first flow of air, and
when the first slot is at least partially vacant and the second slot is at least partially vacant, configuring the apparatus with the second tier in the first extended position and positioning the apparatus within the first slot and the second slot to hinder the first flow and second flow of air.

12. The method of claim 11, wherein, in the apparatus, the first tier and the second tier are elongate in a first direction corresponding to the first and second flows of air.

13. The method of claim 11, wherein, in the apparatus:
a first portion of the first spring is coiled about a first cylinder;
a second portion of the first spring is received within a first recess; and
when the second tier is in the first nested position, an additional portion of the first spring is compressed onto the first cylinder and the first cylinder is at least partially received within the first recess.

14. The method of claim 11, wherein the chassis further includes a third slot and the apparatus further includes:
- a third tier configured to be received within the second tier in a second nested position;
- a second latch configured to engage a second striker, the second latch and second striker maintaining the third tier nested in the second nested position when latched;
- a second travel limiter, including a second track follower engaging a second track, movement of the second track follower along the second track limiting relative movement between the second and third tiers to movement between the second nested position and a second extended position; and
- a second spring biasing the third tier to the second extended position, wherein:
- when the second latch is released, the second spring urges the third tier to the second extended position;
- when the third tier is in the second extended position and the second tier is in the first extended position, the apparatus is configured to hinder the first flow of air, the second flow of air, and a third flow of air through a third slot of the chassis when positioned within the first, second, and third slots;
- when the second tier is in the first extended position, or when third tier is in the second extended position, the apparatus is configured to hinder the first flow of air and the second flow of air when positioned within the first and second slots; and
- when the second tier is in the first nested position and the third tier is in the second nested position, the apparatus is configured to hinder the first flow of air when positioned within the first slot, the method further including:
- when the first slot is at least partially vacant, the second slot is at least partially vacant, and the third slot is at least partially vacant: configuring the apparatus with the second tier in the first extended position and with the third tier in the second extended position and positioning the apparatus within the first slot, the second slot, and the third slot to hinder the first flow, the second flow, and the third, flow of air.

15. The method of claim 14, wherein, in the apparatus:
- a first portion of the first spring is coiled about a first cylinder;
- a second portion of the first spring is received within a second cylinder;
- a first portion of the second spring is coiled about the second cylinder;
- when the second tier is in the first nested position, an additional portion of the first spring is compressed onto the first cylinder and the first cylinder is at least partially received within the second cylinder; and
- when the third tier is in the second nested position, an additional portion of the second spring is compressed onto the second cylinder.

16. The method of claim 15, wherein, in the apparatus:
- a second portion of the second spring is received within a first recess; and
- when the third tier is in the second nested position, the additional portion of the second spring is compressed onto the second cylinder and the second cylinder is at least partially received within the first recess.

17. The method of claim 14, the apparatus further including:
- a first window in the first tier providing access to release the first latch;
- a second window in the first tier and a third window in the second tier cooperating to provide access to release the second latch, wherein:
- when the second tier is in the first nested position and the third tier is in the second nested position, the first latch is accessible via the first window and the second latch via the second and third windows.

18. The method of claim 17, wherein, in the apparatus:
- when the second tier is in the first extended position, the second latch is inaccessible.

19. The method of claim 14, wherein, in the apparatus, the first spring is configured have a greater spring constant than the second spring, such that, when the second tier is in the first extended position and the third tier is in the second extended position, an application of force to the third tier causes third tier to move to the second nested position before the second tier moves to the first nested position.

20. The method of claim 14, wherein, in the apparatus, the second spring is configured have a greater spring constant than the first spring, such that, when the second tier is in the first extended position and the third tier is in the second extended position, an application of force to the third tier causes second tier to move to the first nested position before the third tier moves to the second nested position.

* * * * *